United States Patent
Kim

(10) Patent No.: US 7,563,676 B2
(45) Date of Patent: Jul. 21, 2009

(54) NOR-TYPE FLASH MEMORY CELL ARRAY AND METHOD FOR MANUFACTURING THE SAME

(75) Inventor: Heong Jin Kim, Gyeongsangbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 391 days.

(21) Appl. No.: 11/646,088

(22) Filed: Dec. 26, 2006

(65) Prior Publication Data

US 2007/0148830 A1    Jun. 28, 2007

(30) Foreign Application Priority Data

Dec. 26, 2005    (KR) ...................... 10-2005-0129789

(51) Int. Cl.
*H01L 31/072*    (2006.01)

(52) U.S. Cl. .................. 438/258; 438/265; 257/E21.68

(58) Field of Classification Search ................ 438/262, 438/267, 266, 265, 264, 258, 259, 260, 261, 438/263; 257/321, 315, 316, 314, 317, 318, 257/319

See application file for complete search history.

(56) References Cited

U.S. PATENT DOCUMENTS 6,518,072 B1 *   2/2003   Huster et al. ................... 438/4
6,570,214 B1     5/2003   Wu
7,214,579 B2 *   5/2007   Widdershoven et al. ...... 438/211
2002/0011608 A1* 1/2002   Lee ............................. 257/200

OTHER PUBLICATIONS

Chinese Office Action dated Apr. 11, 2008 (with English Translation); Chinese Patent Application No. 200610172777.1; State Intellectual Property Office of People's Republic of China, Republic of China.

* cited by examiner

*Primary Examiner*—Tu T Nguyen
*Assistant Examiner*—Mohammad Mohsin Choudhry
(74) *Attorney, Agent, or Firm*—The Law Offices of Andrew D. Fortney; Andrew D. Fortney

(57) ABSTRACT

Disclosed is a non-volatile (e.g., NOR type flash) memory cell array and a method for manufacturing the same. The memory cell array includes a plurality of isolation layers on a semiconductor substrate, parallel to a bit line and defining an active device area, a plurality of common source areas in the semiconductor substrate, separated from each other by the isolation layers such that the common source areas connect memory cells adjacent to each other in a bit line direction, a common source line on the semiconductor substrate, connected to each source area and extending in a word-line direction, an insulating spacer along a first sidewall of the common source line, a gate at a second sidewall of the insulating spacer including a tunnel oxide layer, a first electrode, an inter-electrode dielectric layer, and a second electrode, and a drain area in the semiconductor substrate on an opposite side of the gate from the common source area.

9 Claims, 5 Drawing Sheets

NOR-TYPE FLASH MEMORY CELL ARRAY AND METHOD FOR MANUFACTURING THE SAME

This application claims the benefit of Korean Application No. 10-2005-0129789, filed on Dec. 26, 2005, which is incorporated by reference herein in its entirety.

BACKGROUND OF THE INVENTION

1. Field of the Invention

The present invention relates to a nonvolatile (e.g., flash) memory device. More specifically, the present invention relates to a NOR-type flash memory cell array structure and a method for manufacturing the same.

2. Description of the Related Art

A flash memory is a kind of PROM (programmable ROM) capable of electrically re-writing data. The flash memory can perform a program input scheme of an erasable PROM (EPROM) and an erase scheme of an electrically erasable PROM (EEPROM) using one transistor by combining the advantages of an EPROM, in which a memory cell includes one transistor so that a cell area is small, but data must be erased at a time by UV rays, and the EEPROM, in which data can be electrically erased, but the cell may include two transistors so that a cell area becomes large. Flash memory may also be known as flash EEPROM. Such a flash memory is referred to as a nonvolatile memory since stored information is not erased even though power is turned off, which is different from a dynamic RAM (DRAM) or a static RAM (SRAM).

Flash memory may be classified into a NOR-type structure in which cells are arranged in parallel between a bit line and a ground and a NAND-type structure in which cells are serially arranged between the bit line and the ground. Since the NOR-type flash memory having the parallel structure can perform high-speed random access when a reading operation is performed, the NOR-type flash memory is widely used for booting a mobile telephone. The NAND-type flash memory having the serial structure has low reading speed but high writing speed so that the NAND-type flash memory is suitable for storing data and is advantageous for miniaturization.

In addition, the flash memory can be classified into a stack gate type and a split gate type in accordance with the structure of a unit cell, and can be similarly classified into a floating gate device and a silicon-oxide-nitride-oxide-silicon (SONOS) device in accordance with the shape and/or materials of a charge storage layer. Among them, the floating gate device includes floating gates having polycrystalline silicon and being surrounded by an insulating substance. Charges are implanted into or discharged from the floating gates by channel hot carrier injection or Fowler-Nordheim (F-N) tunneling so that data can be stored and erased.

Meanwhile, in the procedure of manufacturing the NOR type flash memory device, a cell threshold voltage is adjusted, and a stack gate including a floating gate, an inter-gate insulating layer (e.g., Oxide-Nitride-Oxide) and a control gate is formed. In addition, a common source line is formed through a self-aligned source (SAS) process. The SAS technique is used for reducing a cell size in a word-line direction. According to SAS technique, a common source line is formed through a dopant implantation process after etching a field oxide layer on the basis of etching selectivity among a polysilicon layer for a gate electrode, a silicon substrate, and a field oxide layer.

Recently, as the high integration and the high speed of a device are accelerated, it is necessary to design a smaller memory cell and a resistor having lower resistance. However, a manufacturing process of a conventional NOR-type cell structure may have some problems. For example, when an SAS process is performed in order to form a common source line, the unevenness or topology of an SAS line can cause an increase in resistance. This becomes a factor of reducing an operational speed of the device. In addition, the limitation of a photo process makes it difficult to control a line width of a control gate, so voids may be created due to the lack of a gap-fill margin when a polysilicon metal dielectric (PMD) layer is deposited on a drain area. Accordingly, when a tungsten plug is formed in the drain area, there may occur a short between a control gate and a bit line.

SUMMARY OF THE INVENTION

The present invention has been made to solve the above problem(s), and therefore, it is an object of the present invention to provide a method for manufacturing a highly integrated nonvolatile (e.g., NOR type flash) memory device without employing an SAS technique.

It is another object of the present invention to provide a nonvolatile (e.g., NOR type flash) memory device and a method for manufacturing the same, in which a control gate forming a stacked (or control) gate is self-aligned with a floating gate.

In order to accomplish the objects according to the present invention, there is provided a method for manufacturing a nonvolatile (e.g., NOR type flash) memory cell array, the method comprising the steps of: (a) forming a plurality of isolation layers, separated from each other by a predetermined distance and parallel to each other, on a semiconductor substrate, (b) forming a plurality of lines (or line patterns) orthogonal to the isolation layers and separated from each other by a predetermined distance, in which the lines include a tunnel oxide layer, a first electrode layer, an inter-electrode dielectric layer, and a first capping layer, (c) forming an insulating spacer on a sidewall of each line, (d) forming a source area by implanting a first dopant into an upper part of the semiconductor substrate between the lines, (e) selectively removing the first capping layer from the lines, (f) forming a common source line on the source area and between neighboring insulating spacers while forming a plurality of second electrodes separated from each other by a predetermined distance on the inter-electrode dielectric layers, (g) forming a plurality of gates opposite to each other by removing a portion of the line exposed between the second electrodes, and (h) forming a drain area by implanting a second dopant into an upper part of the semiconductor substrate between the gates.

According to another aspect of the present invention, there is provided a non-volatile (e.g., NOR type flash) memory cell array including a plurality of isolation layers on a semiconductor substrate and parallel to a bit line and defining an active device area, a plurality of common source areas in the semiconductor substrate and separated from each other by the isolation layers such that the common source areas connect memory cells adjacent to each other in a bit line direction, a common source line on the semiconductor substrate, connected to each source area and extending in a word-line direction, an insulating spacer along a first sidewall of the common source line, a gate at a second sidewall of the insulating spacer and comprising a tunnel oxide layer, a first electrode, an inter-electrode dielectric layer, and a second electrode, and a drain area in the semiconductor substrate on an opposite side or the gate from the common source area.

DETAILED DESCRIPTION OF THE INVENTION

Hereinafter, a NOR type flash memory cell array and a method for manufacturing the same according to a preferred embodiment of the present invention will be described with reference to FIGS. 1 to 9.

The method for manufacturing a NOR-type flash memory cell array according to the present invention will be described in detail with reference to FIGS. 1 to 8. FIGS. 1 to 8 show sections of an active device area vertical to a word line.

First, a plurality of isolation layers (not shown), which are separated from each other by a predetermined distance (e.g., a predetermined distance apart), are formed on a semiconductor substrate 10 by employing a shallow trench isolation (STI) technique. The isolation layers are parallel to each other in a bit-line direction, and define an active device area. Then, a well is formed in the active device area of the semiconductor substrate. For example, in a case of a P type substrate, a deep N well is formed, and then a pocket P well is formed. Thereafter, a cell threshold voltage is determined, adjusted or set through an implant process.

Figure 1:
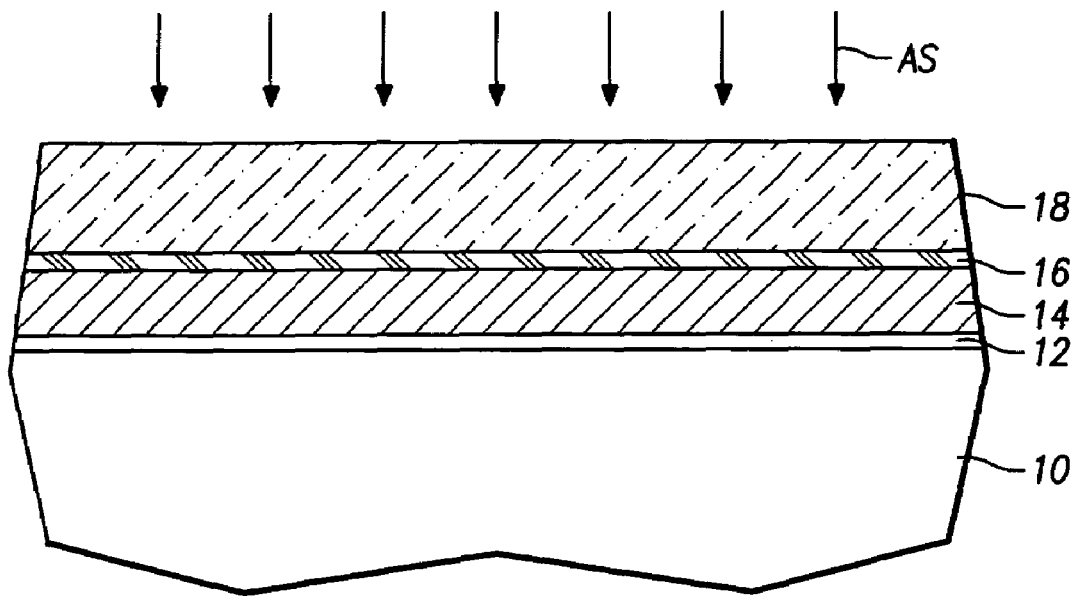
FIGS. 1 to 8 are sectional views showing an active device area vertical to a word line to illustrate the manufacturing process for a NOR-type flash memory cell array in the order of process sequence according to the present invention.

Then, as shown in FIG. 1, a tunnel oxide layer 12 and a first electrode layer 14 are formed in the active device area of the substrate 10. The first electrode layer 14 includes polysilicon doped with impurities. Next, a portion of the first electrode layer 14 formed on the isolation layer is removed, thereby forming a pattern of lines or structures parallel to the isolation layer. The first electrode layer pattern structures are spaced apart from each other in a word-line direction by a predetermined distance and are arranged in parallel to each other in a bit-line direction.

Next, an inter-electrode dielectric layer 16 and a first capping layer 18 are sequentially formed on the entire surface of the substrate 10. The inter-electrode dielectric layer 16 may comprise a single oxide layer or an oxide-nitride-oxide (ONO) dielectric layer, and the first capping layer 18 includes a silicon oxide layer (which may be the same as or different from the single oxide layer when the inter-electrode dielectric layer 16 includes only a single oxide layer). Thereafter, dopants (e.g., As) are implanted into the entire surface of the first capping layer 18 through an implant process, at least when first capping layer 18 comprises an oxide having a similar etch rate as an (upper) oxide layer of the inter-electrode dielectric layer 16. Since the first capping layer into which the dopants are implanted has an etching rate higher than that of other oxide layers formed on the substrate 10, one can selectively remove the first capping layer.

Figure 2:
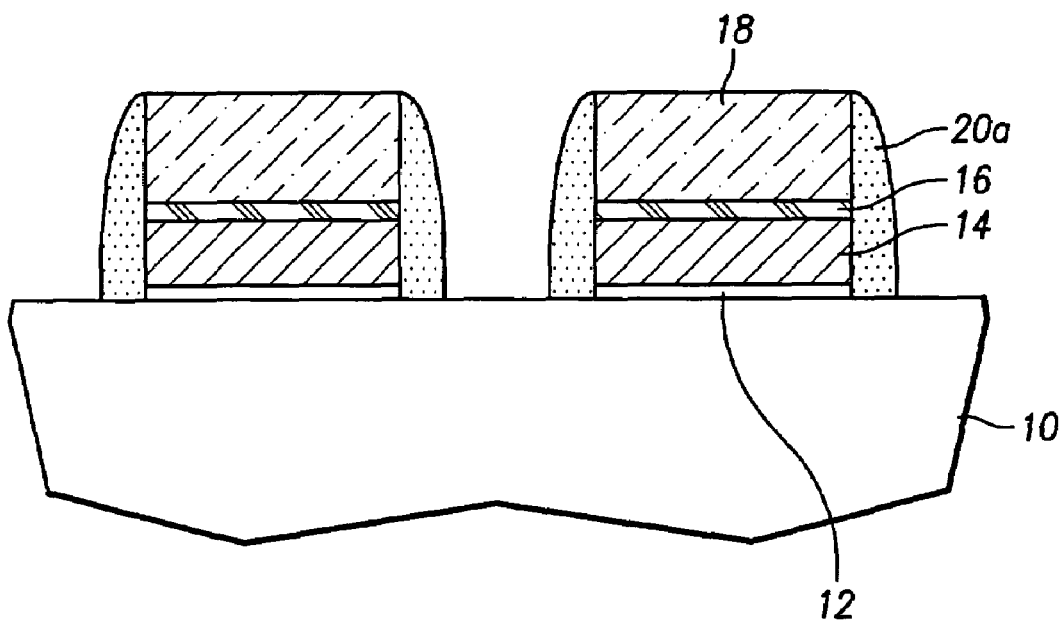

Then, as shown in FIG. 2, a tunnel oxide layer 12, the first electrode layer 14, the inter-electrode dielectric layer 16, and the capping layer 18 are partially removed by a predetermined width in a direction vertical to the isolation layer (that is, in a word-line direction). Through this patterning process, the first electrode layer 14 is divided into a plurality of patterns or lines separated from each other by a predetermined distance in a word-line direction, and the divided pieces of the first electrode layer may be patterned again through a following process, thereby finally forming a floating gate. When the patterning process as shown in FIG. 2 has been completed, a plurality of stacks including the tunnel oxide layer 12, the first electrode layer 14, the inter-electrode dielectric layer 16, and the first capping layer 18 are formed. Hereinafter, these stacks may be referred to as "line patterns".

After forming the line pattern, an insulating layer is formed on the entire surface of the substrate 10, and then an etch back or anisotropic etch process is performed, thereby forming an insulating spacer 20a. The insulating spacer 20a is thereby formed at sidewalls of the line patterns. In addition, if the first capping layer includes a silicon oxide layer, it is preferred that the insulating spacer 20a includes a silicon nitride layer.

Figure 3:
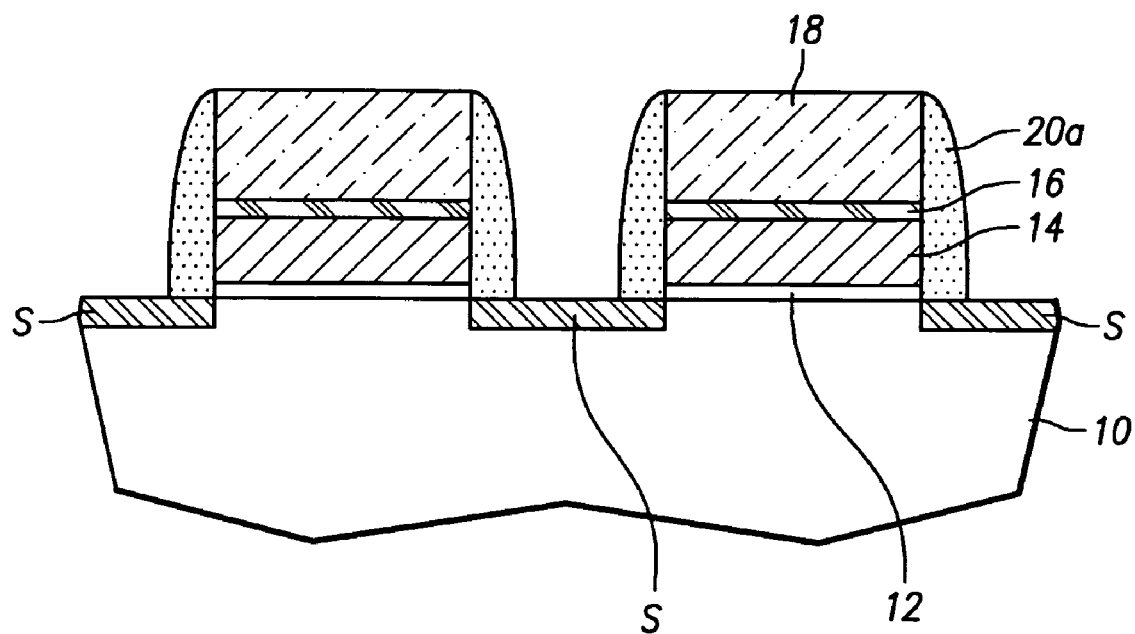

Thereafter, as shown in FIG. 3, dopants are implanted into an upper part of the substrate 10 between the line patterns, that is, between the insulating spacers 20a, thereby forming a diffusion area. This diffusion area serves as a common source (S).

Figure 4:
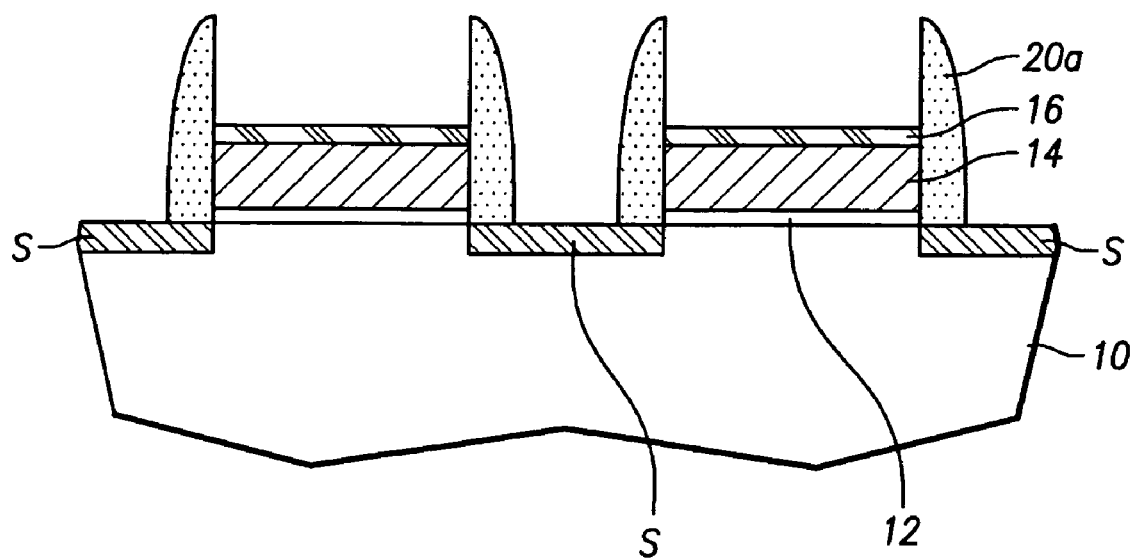

Next, referring to FIG. 4, the first capping layer 18 formed on an upper part of the line pattern is selectively removed. In this case, since the first capping layer 18 has a relatively high etching rate (e.g., as a result of the dopant implantation process described above or an ion implantation process for forming the source area S), the first capping layer is etched prior to other oxide layers. Accordingly, if an etching time is adjusted, only the first capping layer 18 may be selectively removed.

Figure 5:
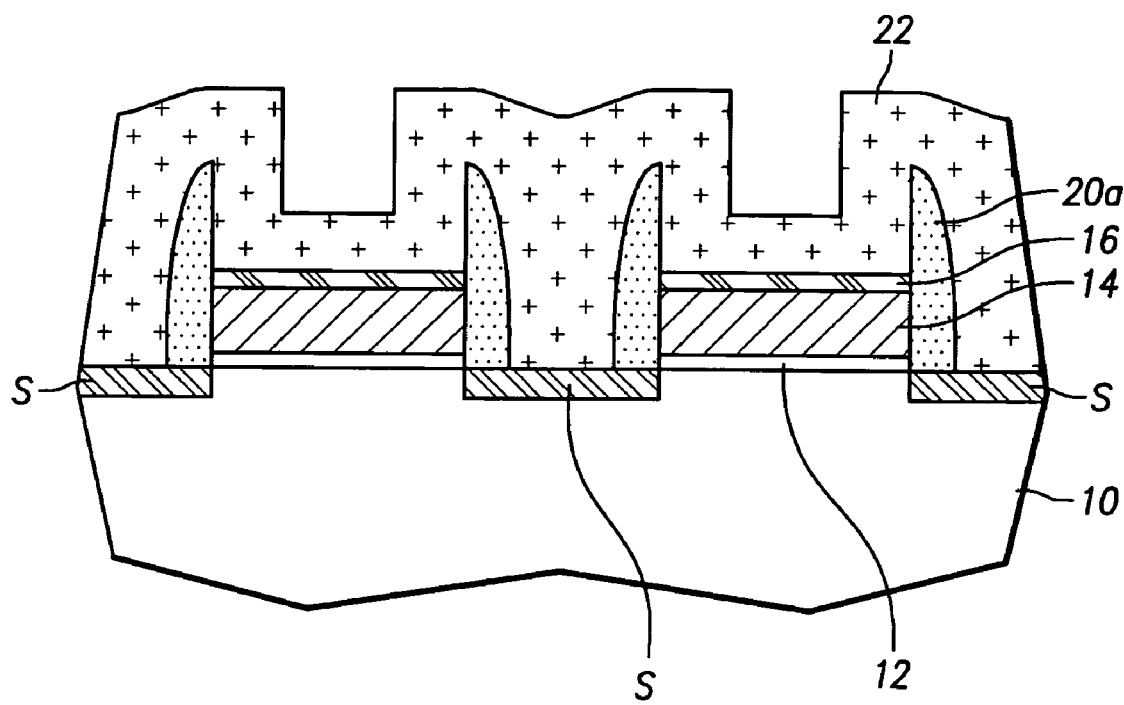
Figure 6:
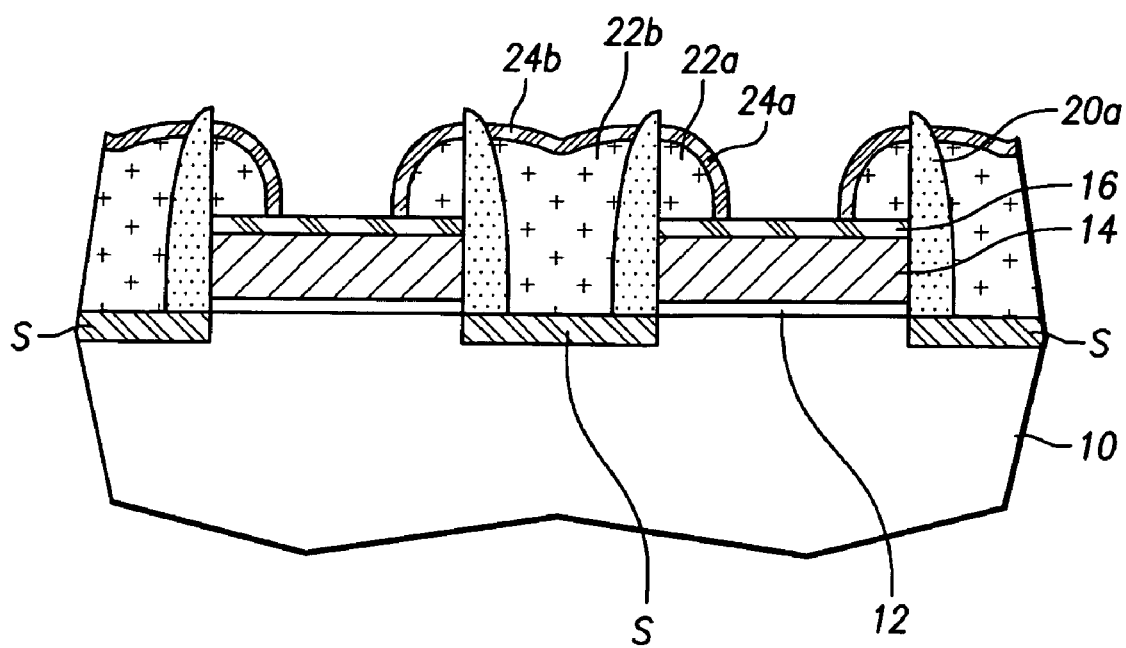

As shown in FIG. 5, a conductive material 22 is formed on the upper parts of the line patterns (that is, the upper parts of the inter-electrode dielectric layers), in which the first capping layer 18 is selectively removed. At the same time, a gap formed between two neighboring insulating spacers 20a is filled with the conductive material 22. It is preferred that the conductive material 22 includes polysilicon doped with impurities. Thereafter, an etch back or anisotropic etch process is performed with respect to the conductive material 22, thereby forming a second electrode layer 22a having a spacer shape and a common source line 22b shown in FIG. 6. In this case, the etch back process is performed until an upper part of the insulating spacer 20a is exposed between the common source line 22b and two second electrode layers 22a adjacent to the common source line 22b. Therefore, the second electrode layer 22a is electrically insulated from the common source line 22b by the exposed spacer 20a.

Figure 7:
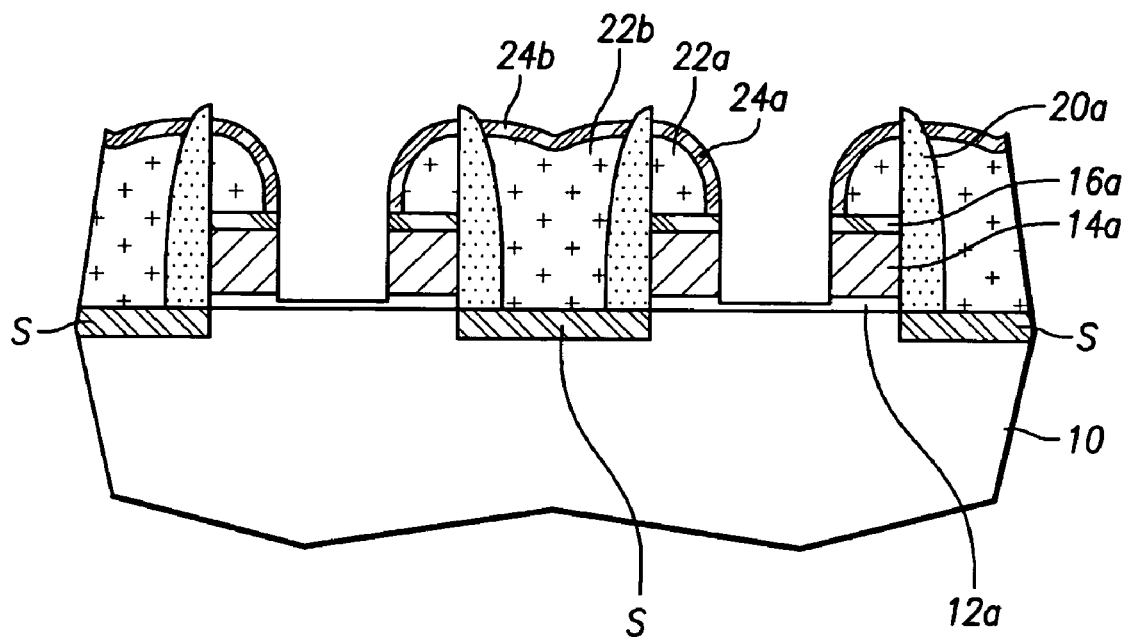

Next, a second capping layer 24a and 24b may be formed on upper parts of a pair of two electrode layers 22a opposite to each other and an upper part of the common source line 22b, respectively. The second capping layers 24a and 24b may be formed by thermally oxidizing the polysilicon of second electrodes 22a and common source line 22b. Thereafter, if a portion of both the inter-electrode dielectric layer 16 and the first electrode layer 14 between the second electrode layers 22a formed within the spacers 20a is removed through a photolithography process and an etching process, a pair of stacked gates opposite to each other is formed as shown in FIG. 7. These gates include a tunnel oxide layer 12a, a first electrode layer 14a, an inter-electrode dielectric layer 16a, and the second electrode layer 22a, in sequence from the substrate. The first electrode 14a and the second electrode 22a serve as a floating gate and a control gate, respectively.

Figure 8:
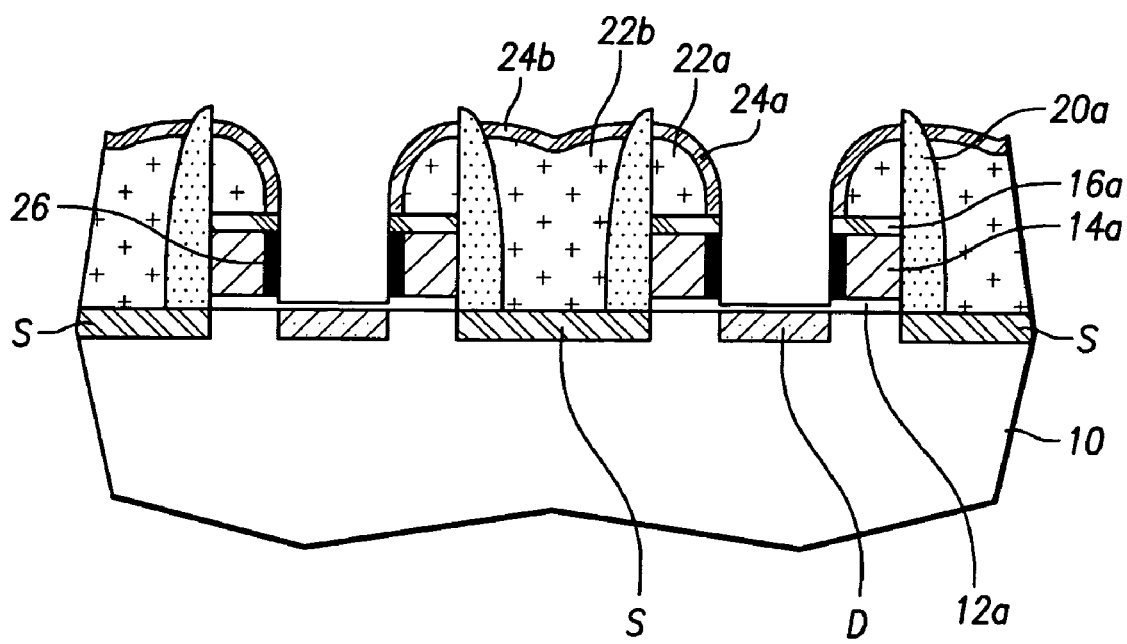

Then, as shown in FIG. 8, a sidewall insulating layer 26 for insulating the first electrode 14a is formed at sidewalls of the gates. In addition, if dopants are implanted into an upper part of the substrate 10 exposed between a pair of the gates, so a drain area D is formed, a flash memory cell array is completely formed.

Figure 9:
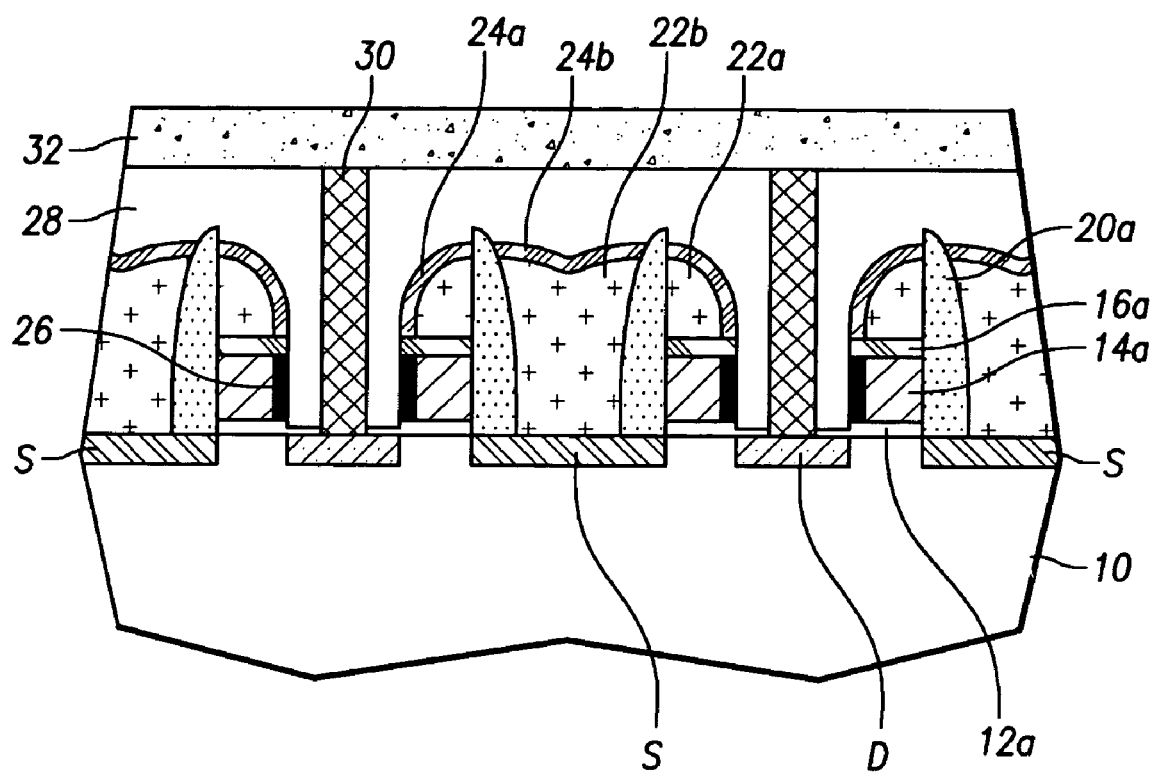
FIG. 9 is a sectional view showing an active device area vertical to a word line to illustrate the structure of a NOR-type flash memory cell according to the present invention.

FIG. 9 is a sectional view showing a device having a dielectric layer (PMD) 28, a drain contact 30, and a metal interconnection 32 formed on the flash memory cell array structure according to the present invention.

Referring to FIG. 9, a common source area S, which connects neighboring memory cells in a row, is linked to the common source lines 22b formed on the substrate 10. The common source line 22b has sidewalls formed with the insulating spacer 20a while extending in a word-line direction. In addition, an opposite sidewall of the insulating spacer 20a, which does not make contact with the common source line 22b, is provided with a stacked gate in which the tunnel oxide layer 12a, the first electrode 14a, the inter-electrode dielectric layer 16a, and the second electrode 22a are sequentially formed from the substrate.

In this case, a sidewall of the second electrode 22a aligned in a bit-line direction is self-aligned with a sidewall of the first electrode 14a. Accordingly, it is possible to minimize the variation of a line width of a control gate. In particular, since the second electrode 22a has the shape of a spacer, it is possible to prevent voids from being created when the dielectric layer 28 is formed, and it is possible to effectively prevent a bit line bridge from occurring between the control gate and a drain contact. In addition, since the margin space for forming the drain contact 30 can be sufficiently ensured within a given area, high integration of the cell can be advantageously achieved.

Meanwhile, different from a common source line formed through a conventional SAS process, the common source line 22b formed together with the second electrode 22a is provided on the substrate 10, so it is easy to control the profile of the common source line 22b. In addition, since the common source line 22b includes a conductive material having a relatively high thickness and a height identical to that of the second electrode 22a, electrical resistance becomes reduced, so it is possible to realize a high-speed device.

As described above, according to the present invention, not only is a common source line formed without employing an SAS technique, but also the common source line is formed by using a material identical to the material forming the control electrode, so it is possible to provide a high-integrated and high-speed nonvolatile (e.g., NOR type flash) memory device.

Further, in a flash memory device according to the present invention, the control gate is self-aligned with the floating gate, so it is possible to sufficiently ensure a process margin for a drain contact.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method for manufacturing a non-volatile memory cell array, the method comprising the steps of:
   (a) forming a plurality of isolation layers a predetermined distance apart from each other and parallel to each other, on a semiconductor substrate;
   (b) forming a plurality of lines orthogonal to the isolation layers and a predetermined distance apart from each other, in which the lines include a tunnel oxide layer, a first electrode layer, an inter-electrode dielectric layer, and a first capping layer;
   (c) forming an insulating spacer on a sidewall of each line;
   (d) forming a source area by implanting a first dopant into an upper part of the semiconductor substrate between the lines;
   (e) selectively removing the first capping layer from the lines;
   (f) forming a common source line on the source area between neighboring insulating spacers while forming a pair of second electrode layers a predetermined distance apart from each other on the inter-electrode dielectric layers;
   (g) forming a plurality of gates opposite to each other by removing a portion of the line exposed between the second electrode layers; and
   (h) forming a drain area by implanting a second dopant into an upper part of the semiconductor substrate between the gates.

2. The method as claimed in claim 1, wherein step (b) includes the sub-steps of:
   (b1) sequentially forming the tunnel oxide layer and the first electrode layer on an entire surface of the semiconductor substrate;
   (b2) removing a portion of the electrode layer on the isolation layer;
   (b3) sequentially forming the inter-electrode dielectric layer and the first capping layer on an entire surface of the semiconductor substrate including the isolation layer and the first electrode layer; and
   (b4) removing a predetermined width of the tunnel oxide layer, the first electrode layer, the inter-electrode dielectric layer, and the first capping layer in a direction vertical to the isolation layer.

3. The method as claimed in claim 2, wherein, in step (b4), the first electrode layer comprises a plurality of patterned structures spaced from each other by a predetermined distance.

4. The method as claimed in claim 2, further comprising a step of implanting dopants into the first capping layer prior to step (b4).

5. The method as claimed in claim 1, wherein step (f) includes the sub-steps of:
   (f1) depositing a conductive material on the lines and between the neighboring insulating spacers; and
   (f2) simultaneously forming the common source line and the second electrode layer by performing an etch back process with respect to the conductive material.

6. The method as claimed in claim 1, wherein the common source line is electrically separated from the second electrode layer by the insulating spacer.

7. The method as claimed in claim 5, wherein, in step (f2), the etch back process is performed until a portion of the insulating spacer is exposed.

8. The method as claimed in claim 1, wherein the step (g) includes:
   (g1) forming a second capping layer on the second electrode layer and the common source line; and
   (g2) removing a portion of the inter-electrode dielectric layer and the first electrode layer between a pair of second electrode layers.

9. The method as claimed in claim 1, further comprising a step of forming a sidewall insulating layer on sidewalls of the gates before performing the step (h).

* * * * *